(12) United States Patent
Morgan et al.

(10) Patent No.: US 6,236,254 B1
(45) Date of Patent: May 22, 2001

(54) LOW VOLTAGE AMPLIFICATION CIRCUIT WITH BIAS COMPENSATION

(75) Inventors: Mark W. Morgan, Allen; Fernando D. Carvajal, Fairview, both of TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/617,078

(22) Filed: Jul. 17, 2000

Related U.S. Application Data

(60) Provisional application No. 60/144,379, filed on Jul. 16, 1999.

(51) Int. Cl.[7] .............................. H03L 5/00; G06G 7/12; H03K 3/59
(52) U.S. Cl. ...................... 327/307; 327/362; 327/511
(58) Field of Search ...................... 327/307, 312, 327/316, 323, 332, 362, 363, 538, 542, 543, 511, 378

(56) References Cited

U.S. PATENT DOCUMENTS

| | | | |
|---|---|---|---|
| 4,687,994 | * 8/1987 | Fulkerson et al. | 327/511 |
| 4,883,991 | * 11/1989 | Kroner et al. | 327/362 |
| 5,260,614 | * 11/1993 | Theus et al. | 327/362 |
| 5,798,664 | * 8/1998 | Nagahori et al. | 327/307 |
| 6,005,431 | * 12/1999 | Mehr et al. | 327/307 |

* cited by examiner

*Primary Examiner*—Toan Tran
(74) *Attorney, Agent, or Firm*—Mark E. Courtney; W. James Brady; Frederick J. Telecky, Jr.

(57) ABSTRACT

A circuit (10) operates at relatively low values of the supply voltage, and includes a differential input circuit (16) which receives a differential input signal at first and second terminals (18, 21). A differential voltage derived by the input circuit from the differential input signal is present at third and fourth terminals (28, 31) and is amplified by a differential amplifier (12). A differential level adjuster (14) adjusts output voltages from the amplifier to suitable values for application to a matcher (15). The matcher (15) generates two currents that also flow within a differential compensator (17), and that match respective currents flowing in the amplifier. The differential compensator then provides a suitable current to each of the third and fourth terminals, such that the current flow between the first and third terminals, and between the second and fourth terminals, is substantially zero.

15 Claims, 1 Drawing Sheet

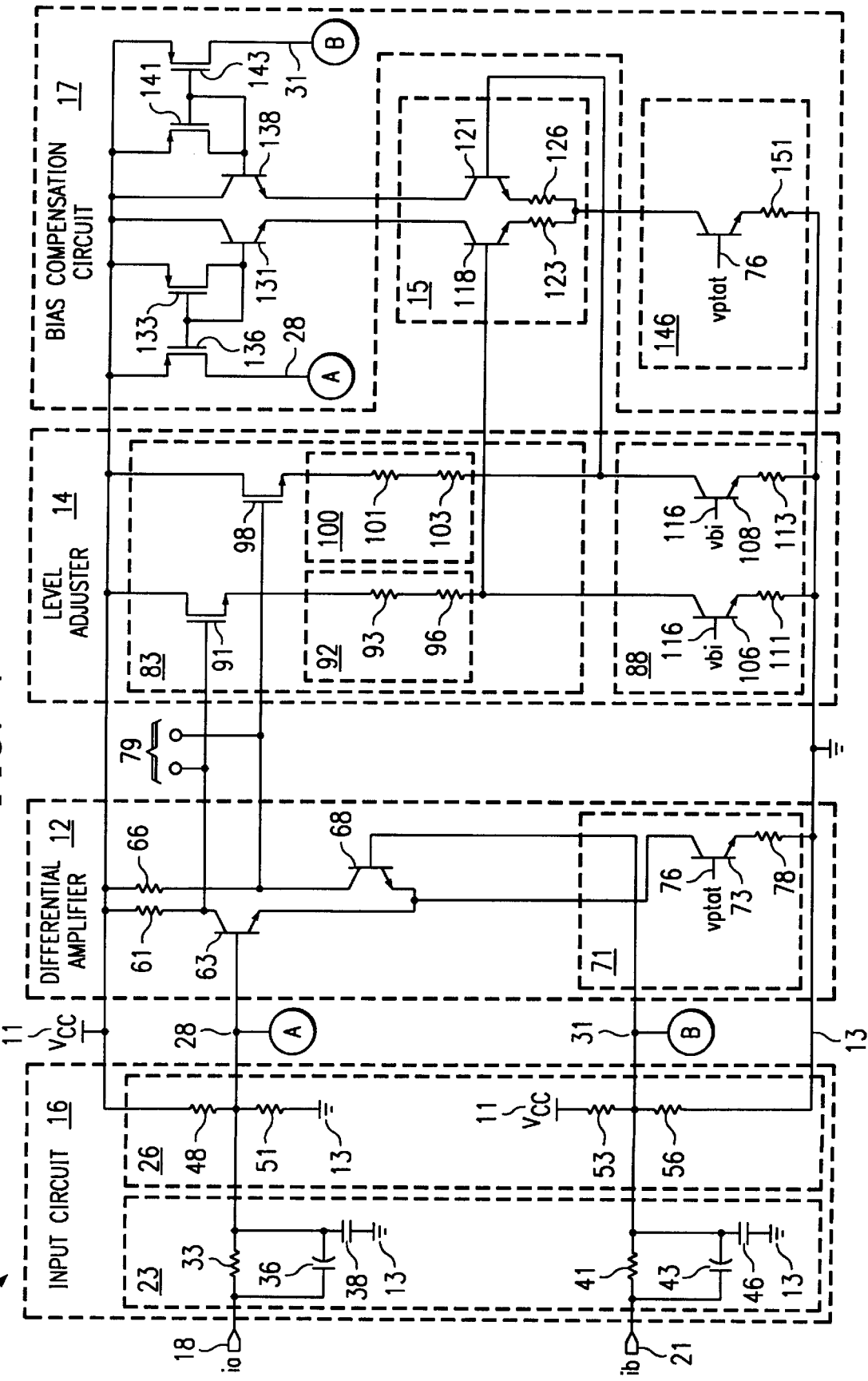

LOW VOLTAGE AMPLIFICATION CIRCUIT WITH BIAS COMPENSATION

This application claims priority under 35 USC §119 (e)(1) of Provisional application Ser. No. 60/144,379, filed Jul. 16, 1999.

TECHNICAL FIELD OF THE INVENTION

This invention relates in general to circuits which include amplifiers and, more particularly, to a circuit which includes an amplifier with bias compensation.

BACKGROUND OF THE INVENTION

As technology has continued to advance, the need for smaller and faster circuitry has increased. In order to meet this need, circuits have been fabricated with smaller and smaller die sizes and etches. One result of the shift to smaller sizes has been an increase in concern with the ability of an integrated circuit to dissipate heat. The amount of heat which must be dissipated can be reduced by reducing the amount of heat generated. One method for reducing the heat generated by a particular integrated circuit is to decrease the supply voltage level with which the circuit works. In this regard, in the context of digital circuits, the industry is shifting from a 5 volt standard to a 3.3 volt standard, for example as reflected by the Low-Voltage Differential Signaling (LVDS) portion of an industry standard known as the TIA/EIA-644 standard.

One common portion of an integrated circuit is an amplifier circuit, which may be used in a variety of applications, such as televisions, radios, computers and stereo systems. In the context of digital circuits, certain digital circuits which include amplifiers are involved in the industry shift from 5 volts to 3.3 volts. Amplifier circuit designs have often included integrated bias compensation, in order to increase the effectiveness and accuracy of the amplifier. In particular, differential amplifiers often include integrated bias compensators in order to reduce the errors caused when, for example, low frequency monitor circuits pick off input voltages to the amplifier for comparison. Traditional designs of amplifiers with bias compensation are tailored for use with the traditional supply voltage of 5 volts or more. The trend toward lower voltages in integrated circuits has caused these traditional compensated amplifier designs to fail at the lower voltages. More specifically, at a supply voltage of about 3.3 volts, traditional amplifiers with bias compensation do not have sufficient voltage headroom to allow the amplifier to operate, because transistors for both the amplifier and the compensation circuit are coupled in series with each other between the supply voltage and ground, or between two different supply voltages. That is, the amplification and the compensation are both performed in a single stage. When the supply voltage is decreased, the transistors shut down as they run out of operating headroom, for example where wide variance in input common mode voltages are applied to the inputs of a differential amplifier and cause the transistors to lose compliance and shut down.

One traditional circuit of this type includes a pair of input resistors that feed a differential input voltage to respective voltage dividers, and from there to bases of a differential pair of amplifier transistors. If the bias currents into the bases of these two transistors are drawn through the input resistors, it contributes error to the function of the voltage divider. This error is traditionally avoided by coupling a differential pair of sensing transistors between a supply voltage and the collectors of the differential pair of amplifier transistors, in order to sense the currents through the amplifier transistors. Two sourcing transistors are each responsive to a respective sensing transistor, and each source the base current for a respective amplifier transistor. This allows the entire base current for each amplifier transistor to be supplied from the corresponding sourcing transistors, so that little or no current is drawn through the input resistors. While this arrangement has been satisfactory for use with a traditional supply voltage of 5 volts, it does not operate satisfactorily under all operational conditions with a reduced supply voltage of 3.3 volts. In particular, due to the sourcing transistors, the emitters of the sensing transistors operate two junction voltages below the supply voltage and, at 3.3 volts, the amplifier transistors do not have sufficient voltage headroom to operate properly over the desired input common mode range.

SUMMARY OF THE INVENTION

From the foregoing, it may be appreciated that a need has arisen for a method and apparatus in which an amplifier with bias compensation operates satisfactorily at a relatively low supply voltage.

According to one form of the present invention, an apparatus is provided to address this need, and includes: an input circuit having a first terminal and a second terminal, an input voltage being applied to the first terminal and a further voltage being generated at the second terminal, the further voltage being a function of the input voltage; an amplifier coupled to the second terminal of the input circuit and operable to output an amplified voltage, the amplified voltage being a function of the further voltage, the amplifier having a first current flowing therein which is proportional to the amplified voltage; a matcher coupled to the amplified voltage from the amplifier, the matcher being operable to generate a second current distinct from and proportional to the first current; and a compensator coupled to the matcher and responsive to the second current for generating a third current which is supplied to the second terminal of the input circuit, and which has a magnitude such that a current flow out of the input circuit through the second terminal is substantially zero and the input voltage is substantially equal to the further voltage.

Another form of the present invention involves a method of effecting compensation in a circuit that includes an input portion which responds to an input voltage applied to a first terminal by generating at a second terminal a further voltage which is a function of the input voltage, and that includes an amplifier coupled to the second terminal and operable to output an amplified voltage which is a function of the further voltage. The method includes: causing a first current to flow in the amplifier, the first current being proportional to the amplified voltage; generating in a matcher circuit coupled to the amplifier a second current which is distinct from and proportional to the first current; generating in a compensator coupled to the matcher a third current which is a function of the second current; and supplying the third current to the second terminal of the input circuit, the magnitude of the third current being such that a current flow out of the input circuit through the second terminal is substantially zero, so that the input voltage is substantially equal to the further voltage.

BRIEF DESCRIPTION OF THE DRAWINGS

A better understanding of the present invention will be realized from the following detailed description, taken in conjunction with the accompanying drawing, where FIG. 1 is a schematic diagram of a circuit which embodies the invention, and which includes an amplifier with bias compensation.

DETAILED DESCRIPTION OF THE INVENTION

FIG. 1 is a schematic diagram of a circuit 10 which is implemented in an integrated circuit, and which includes an amplifier circuit with bias compensation. In the disclosed embodiment, the circuit 10 is part of a high speed data transmission receiver for a differential signal, but the invention is not limited to such a receiver. The circuit 10 includes a predetermined supply voltage Vcc 11, a ground 13, an input circuit 16, a differential amplifier 12, a level adjuster 14, a matching circuit 15, and a bias compensation circuit 17. The voltage Vcc 11 may be of any suitable value, and in the disclosed embodiment is 3.3 Volts. However, the disclosed circuit will work properly at even lower voltages, including voltages below 3 volts.

The differential input circuit 16 includes a first input terminal 18, a second input terminal 21, a signal conditioner circuit 23, a voltage divider circuit 26, a third terminal or node 28, and a fourth terminal or node 31. The first and second terminals 18 and 21 form a differential input pair. In the disclosed embodiment, a differential signal applied to the bias compensation circuit 10 includes first and second voltages applied to the first and second terminals 18 and 21, respectively. In the disclosed embodiment, the first and second voltages may vary over a large range of voltages during operation of the circuit, for example from −2 volts to 4.5 volts.

The signal conditioner circuit 23 includes resistors 33 and 41, and capacitors 36, 38, 43, and 46. The resistor 33 has a first end coupled to the first terminal 18, and a second end. The capacitor 36 includes a first end coupled to the first terminal 18, and a second end coupled to the second end of the resistor 33. The capacitor 38 has a first end coupled to the second end of the resistor 33, and a second end coupled to ground 13. The resistor 41 has a first end coupled to the second terminal 21, and a second end. The capacitor 43 includes a first end coupled to the second terminal 21, and a second end coupled to the second end of the resistor 41. The capacitor 46 includes a first end coupled to the second end of the resistor 41 and to the second end of the capacitor 43, and a second end coupled to ground 13. In the disclosed embodiment, the resistors 33 and 41 are each 200 KΩ in value. The relatively large value of 200 KΩ is used in order to keep the leakage current under 20 μA, as required by the Low Voltage Differential Signaling (LVDS) portion of the industry standard known as TIA/EIA-644. The capacitors 36 and 43 may be of any appropriate value to provide suitable signal conditioning and, in the disclosed embodiment, have a substantially equal value. Similarly, the capacitors 38 and 46 may be of any suitable value and, in the disclosed embodiment, are of substantially equal value. The signal conditioner 23 operates to provide suitable conditioning for the respective voltages of a differential signal applied at the first and second terminals 18 and 21.

The voltage divider 26 includes two resistor pairs which respectively include resistors 48 and 51, and resistors 53 and 56. The resistor 48 includes a first end coupled to Vcc 11, and a second end coupled to the second end of the resistor 33 of the signal conditioner circuit 23. The resistor 51 includes a first end coupled to the second end of the resistor 48, and a second end coupled to ground 13. The resistors 48 and 51 operate as a voltage divider. In the disclosed embodiment, the resistor 48 has a 50 KΩ value and the resistor 51 has a 250 KΩ value.

The resistor 53 includes a first end coupled to Vcc 11, and a second end coupled to the second end of the resistor 41 of the signal conditioner circuit 23. The resistor 56 includes a first end coupled to the second end of the resistor 53, and a second end coupled to ground 13. The resistors 53 and 56 form a voltage divider. In the disclosed embodiment, the resistor 53 has a value of 50 KΩ and the resistor 56 has a value of 250 KΩ. Any other suitable values may be used for the resistors 48, 51, 53 and 56 in order to achieve the desired voltage divider functionality.

The third terminal 28 is coupled to the second end of the resistor 48. The fourth terminal 31 is coupled to the second end of the resistor 53. The differential output of the voltage divider 26 appears at the third and fourth terminals 28 and 31.

The differential amplifier 12 includes resistors 61 and 66, transistors 63 and 68, and a temperature compensation circuit 71 which is a temperature compensated current sink. The resistor 61 includes a first end coupled to Vcc 11, and a second end. The transistor 63 includes a collector coupled to the second end of the resistor 61, a base coupled to the third terminal 28, and an emitter coupled to the temperature compensation circuit 71. The resistor 66 includes a first end coupled to Vcc 11, and a second end. The transistor 68 includes a collector coupled to the second end of the resistor 66, a base coupled to the fourth terminal 31, and an emitter coupled to the temperature compensation circuit 71. The resistor 61 and the transistor 63 operate to generate a first amplified voltage by amplifying the voltage received at the base of the transistor 63 from the third terminal 28, and also generate a first current through the transistor 61 which is proportional to the first amplified voltage. Similarly, the resistor 66 and the transistor 68 operate to generate a second amplified voltage by amplifying the voltage received at the base of the transistor 68 from the fourth terminal 31, and also generate a second current through the transistor 63 which is proportional to the second amplified voltage. The gain of the amplifier 12 is determined by appropriate selection of the resistors 61 and 66, and by characteristics of the temperature compensation circuit 71. In the disclosed embodiment, the resistors 61 and 66 each have a value of 6.5 KΩ, but may be of any suitable value to provide appropriate amplification for the intended value of Vcc 11. In the disclosed embodiment, the transistors 63 and 68 are fabricated on the same integrated circuit chip so as to be substantially identical in size and other characteristics, and they thus operate in a substantially identical manner.

The temperature compensation circuit 71 includes a transistor 73, and a resistor 78. The transistor 73 includes a collector coupled to both of the emitters of the transistors 63 and 68, a base coupled to a reference voltage Vptat 76, and an emitter. The reference voltage Vptat is an accurate reference voltage which is varied in a precisely controlled manner in response to temperature variations, and which is generated from a known type of circuit (not illustrated). The resistor 78 includes a first end coupled to the emitter of the transistor 73, and a second end coupled to ground 13. The temperature compensation circuit 71 causes the differential amplifier 12 to provide a substantially uniform level of gain under varying temperature conditions, by varying the current flowing through the temperature compensation circuit 71 in response to temperature changes. In particular, variation with temperature changes of the current flowing through the temperature compensation circuit 71 compensates for temperature induced changes in the characteristics of the resistors 61 and 66 in the differential amplifier 12.

Two output terminals 79 are respectively coupled to the collectors of transistors 63 and 68, and operate to allow components external to the circuit 10 to use a differential output voltage which is defined by the first and second amplified voltages from the differential amplifier 12.

The level adjuster circuit 14 includes a differential voltage adjuster 83 and a current regulator 88. The differential voltage adjuster 83 includes two voltage follower transistors 91 and 98, a first resistor pair 92 which includes two resistors 93 and 96, and a second resistor pair 100 which includes two resistors 101 and 103. The transistor 91 includes a drain coupled to Vcc 11, a gate coupled to the collector of transistor 63, and a source. The resistor 93 includes a first end coupled to the source of the transistor 91, and a second end. The resistor 96 includes a first end coupled to the second end of the resistor 93, and a second end coupled to the current regulator 88. The transistor 98 includes a drain coupled to Vcc 11, a gate coupled to the collector of transistor 63, and a source. The resistor 101 includes a first end coupled to the source of the transistor 98, and a second end. The resistor 103 includes a first end coupled to the second end of the resistor 101, and a second end coupled to the current regulator 88.

The first and second resistor pairs 92 and 100 are self compensating for variations in temperature. In the disclosed embodiment, the resistor 93 and the resistor 101 are poly resistors, while the resistors 96 and 103 are base diffused resistors. By forming the two constituent resistors of each resistor pair 92 and 100 from different materials, the resistor pairs self compensate for temperature variations. In particular, the respective materials used to form the two resistors of each of the pairs 92 and 100 are chosen so that, for a given temperature change, the temperature induced change in the resistance of one resistor of a resistor pair will be offset by a complementary and opposite change in resistance of the other resistor in the resistor pair. In the disclosed embodiment, the transistors 91 and 98 are MOSFET transistors and are fabricated on the same chip so as to be substantially identical in size and other characteristics.

The differential level adjuster 83 operates to step down the first and second amplified voltages received from terminals 28 and 31 of the differential amplifier 12, and also serves as a buffer between the amplifier 12 and the matching and compensation circuits 15 and 17. In particular, the transistor 91 and the first resistor pair 92 operate to step down the first amplified voltage in order to generate a first step-down voltage. Similarly, the transistor 98 and the resistor pair 100 operate to step down the second amplified voltage in order to generate a second step-down voltage. The first and second step-down voltages are relatively independent of the input common mode voltage.

The differential current regulator 88 includes transistors 106 and 108, and resistors 111 and 113. The transistor 106 includes a collector coupled to the second end of the resistor 96 of the differential voltage adjuster 83, a gate coupled to a reference voltage Vbi 116, and an emitter. The reference voltage Vbi is an accurate reference voltage which does not need to be varied with temperature, because the resistor pairs 92 and 100 are self compensating. The voltage Vbi is obtained from a known type of circuit (not illustrated), such as a bandgap circuit. The resistor 111 includes a first end coupled to the emitter of the transistor 106, and a second end coupled to ground 13. The transistor 108 includes a collector coupled to the second end of the resistor 103 of the differential voltage adjuster 83, a base coupled to Vbi 116, and an emitter. The resistor 113 includes a first end coupled to the emitter of the transistor 108, and a second end coupled to ground 13. In the disclosed embodiment, the transistors 106 and 108 are bipolar transistors fabricated on the same chip so as to be substantially identical in size and other characteristics. The resistors 111 and 113 have 2 KΩ values, but any suitable resistor value and transistor size may be used. The current regulator 88 operates to provide a substantially constant current flow between Vcc 11 and ground 13 through each of the resistor pairs 92 and 100, so that there will be a predefined voltage drop across each of the resistor pairs 92 and 100.

The matcher circuit 15 includes transistors 118 and 121, and resistors 123 and 126. The transistor 118 includes a collector coupled to the differential compensator 17, a base coupled to the first step-down voltage at the collector of transistor 106, and an emitter. In the disclosed embodiment, the transistor 118 is fabricated to be substantially identical in size and other characteristics to the transistor 63 of the differential amplifier 12. The resistor 123 includes a first end coupled to the emitter of the transistor 118, and a second end coupled to the temperature compensation circuit 148. The transistor 121 includes a collector coupled to the differential compensator 17, a base coupled to the second step-down voltage at the collector of transistor 108, and an emitter. In the disclosed embodiment, the transistor 121 is fabricated to be substantially identical in size and other characteristics to the transistor 68 of the differential amplifier 12. The resistor 126 includes a first end coupled to the emitter of the transistor 121, and a second end coupled to the temperature compensation circuit 148. The matcher circuit 15 generates a third current through transistor 118 which is substantially identical to the first current through transistor 63 of the differential amplifier 12, and generates a fourth current through transistor 121 which is substantially identical to the second current through transistor 68 of the differential amplifier 12.

The differential compensator 17 includes transistors 131, 133, 136, 138, 141 and 143, and a temperature compensation circuit 146. The transistor 131 includes a collector coupled to Vcc 11, a base, and an emitter coupled to the collector of the transistor 118 of the matcher circuit 15. Transistor 131 is fabricated so as to be substantially identical in size and other characteristics to transistor 118 of the matcher circuit 15 and also transistor 63 of the differential amplifier 12. The transistor 133 includes a source coupled to Vcc 11, and a gate and drain coupled to the base of the transistor 131. The transistor 136 includes a source coupled to Vcc 11, a gate coupled to the base of the transistor 131 and the gate of the transistor 133, and a drain coupled to the third terminal 28. The transistor 138 includes a collector coupled to Vcc 11, a base, and an emitter coupled to the collector of the transistor 121 of the matcher circuit 15. Transistor 138 is fabricated so as to be substantially identical in size and other characteristics to the transistor 121 of the matcher circuit 15, and also the transistor 68 of the differential amplifier 12. The transistor 141 includes a source coupled to Vcc 11, and a gate and drain coupled to the base of the transistor 138. The transistor 143 includes a source coupled to Vcc 11, a gate coupled to the base of the transistor 138 and the gate of the transistor 141, and a drain coupled to the fourth terminal 31. In the disclosed embodiment, the transistors 131 and 138 are bipolar transistors, while the transistors 133, 136, 141 and 143 are MOSFET transistors. The transistors 131, 133, 136, 138, 141, and 143 may also be any other suitable type of transistor.

The transistors 131, 133, 136, 138, 141 and 143 operate as a differential compensator. In particular, the transistors 131, 133 and 136 operate to provide a current to the third terminal 28 which is substantially equal in magnitude to the base current drawn by transistor 63. This is accomplished because the transistors 63, 118 and 131 are fabricated to be substantially identical, and the circuitry is designed so that the current flowing through transistor 118 will be the same as the current flowing through transistor 63. This same current will necessarily flow through transistor 131, which is coupled in series with transistor 118, and thus transistors 63, 118 and 131 will all have the same base current. The base current for transistor 131 flows through transistor 133, causing an equal current to be mirrored through transistor 136. The current through transistor 136 is necessarily equal to the base current of transistor 63. Thus, since the current through transistor 136 is supplied to the base of transistor 63, all of the base current for transistor 63 is drawn from transistor 136, and therefore no part of the base current is drawn from the input circuit 23 through resistor 33.

The result is substantially zero current flow through the resistor 33 of signal conditioner circuit 23. The resistor 33, in the disclosed embodiment, has a relatively high resistance with respect to the input voltage range. If a current were allowed to flow through the resistor 33, it would interact with the voltage divider 28 so as to introduce errors over changes in temperature and/or Vcc 11. By reducing the current flowing through the resistor 33 effectively to zero, such errors are avoided. Also, zeroing current flow through the resistor 33 means that the voltage at the base of the transistor 63 of the differential amplifier 12 will be substantially equal to the voltage applied at the third terminal 28.

Similarly, the transistors 138, 141 and 143 operate to provide a current to the fourth terminal 31 which is substantially equal in magnitude to the base current drawn by transistor 68, thereby reducing the current flow through the resistor 41 to substantially zero, to avoid errors in the same manner as discussed above for resistor 33 and transistors 131, 133 and 136. The differential compensator 17 allows the differential amplifier 12 to more accurately amplify the voltages respectively applied at the first and second terminals 18 and 21. In addition, separating the differential amplifier 12 from the differential compensator 17 provides greater voltage headroom for the differential amplifier 12 to operate, which allows for proper operation of the amplifier and thus the overall circuit 10 at low voltages.

The temperature compensator 146 includes a transistor 148 and a resistor 151. The transistor 148 includes a collector coupled to the second ends of each of the resistors 123 and 126 of the matcher circuit 15, a base coupled to the reference voltage Vptat 76, and an emitter. The resistor 151 includes a first end coupled to the emitter of the transistor 148, and a second end coupled to ground 13. The temperature compensation circuit 146, in response to temperature induced changes in the value of the Vptat voltage 76, causes the compensator 17 to operate in a predictable and constant manner independent of temperature changes. In the disclosed embodiment, the transistor 148 is a bipolar transistor, but any other suitable type of transistor may be used.

The resistors 78, 111, 113, and 151 each serve as an emitter degenerator to facilitate matching of transistors. More specifically, they serve to dominate any mismatch which may occur in transistor sizes due to manufacturing process variations.

The circuit 10 operates as follows. For convenience, this explanation of operation is based on an exemplary signal which represents only one side of the differential signal applied to the circuit 10, namely the voltage applied to the first terminal 18. The operation of the circuit 10 for the other side of the differential signal, namely the voltage applied at the second terminal 21, is substantially similar.

A signal is applied to the first terminal 18. The voltage of the signal may vary over a relatively large range of absolute voltages, for example from −2 volts to 4.5 volts. The signal passes through the signal conditioner 23, and specifically through the 200 KΩ resistor 33. The signal then experiences voltage division, due to the resistors 48 and 51 of the voltage divider 26, in conjunction with the resistor 33. In the disclosed embodiment, this effects an attenuation of 1 to 5. The voltage division would vary with changes in temperature and/or Vcc, if a current was allowed to flow through the relatively large resistor 33. Consequently, it is a goal to have no current flowing through the resistor 33. The output voltage of the voltage divider is applied to the third terminal 28.

The differential amplifier 12 receives the voltage from the third terminal 28, and generates an amplified voltage which is proportional to the voltage at the third terminal 28. As part of the amplification, current is caused to flow through the transistor 63, and is proportional to the amplified voltage at the collector of transistor 63. The amplified voltage is supplied to one of the output terminals 79.

The level adjuster 14 then takes the amplified voltage, and steps it down to a lower level. Specifically, the level adjuster 14 steps the voltage down to a range which permits the matcher circuit 15 to operate properly. The matcher circuit 15 then receives the stepped-down voltage from the level adjuster 14. As described previously, the transistor 118 and the transistor 63 are fabricated to be substantially identical, and the voltage applied to the base of the transistor 118 of the matcher circuit 15 will induce a current through the transistor 118 which is identical to the first current through the transistor 63.

The value of resistor 123 is selected to ensure that the current through transistor 118 is identical to the current through transistor 63. Similarly, the value of resistor 126 is selected to ensure that the current through transistor 121 is identical to the current through transistor 68. Stated differently, the differential input signal to the matcher 15 is an amplified version of the differential input signal at the terminals 18 and 21, and therefore the resistors 123 and 126 can be selected to degenerate the gain of the matcher 15 until the collector voltages of the transistors 118 and 121 are the same as the collector voltages of the transistors 63 and 68, respectively.

The current through transistor 131 is necessarily the same as the current through transistor 118, which is coupled in series therewith. The current through the transistor 131 induces a current at the base of the transistor 131 which is substantially equal to the current flowing into the base of the transistor 118, and also equal to the base current flowing into transistor 63, because of the substantially identical characteristics of the transistors 63, 118 and 131. The base current into transistor 131 flows through transistor 133, and an equal mirror current is caused to flow through transistor 136, and is supplied to terminal 28. The mirror current is thus substantially equal to the current flowing into the base of the transistor 63 of the differential amplifier 11. As a result, all current into the base of transistor 63 is drawn from the transistor 136, and no portion of the base current needs to be drawn from the input circuit 16. This reduces the current flow between the first and third terminals 18 and 28 effectively to zero. Reducing the current flow between the first and third terminals 18 and 28 to zero reduces the current flow through the resistor 33 to zero, so that there is no significant voltage across resistor 33. As a result, the voltage at 28 will be substantially the same as the voltage at 18, regardless of variations in temperature or Vcc. Since the differential amplifier 11 is separate from the compensation circuit 17, sufficient headroom exists for the differential amplifier 11 to operate at low values of Vcc, such as 3.3 volts or even values below 3 volts, regardless of significant variations in the voltages of the common mode operation at inputs 18 and 21. Moreover, this operation is possible over the full −2 to 4.5 volt common mode range.

The present invention provides a number of technical advantages. One such technical advantage is that lower supply voltages may be used because of the increased headroom created by effectively separating the amplification and compensation circuitry. That is, the amplification and compensation are effectively performed in separate stages, rather than in a single stage as in preexisting designs. Another technical advantage is that the inputs to the matching circuit and the compensation circuit are independent of the absolute voltages at the inputs to the input circuit, which avoids loss of compliance and shutdown of the circuit at extreme input voltage levels. A further technical advantage is that, by providing an amplified signal to the matcher circuit, the offset errors in the level adjuster transistors are minimized.

Although one embodiment has been illustrated and described in detail, it should be understood that various substitutions and alterations may be made therein without departing from the scope of the present invention. For example, although various types of transistors have been shown and described in the disclosed embodiment, other suitable types of transistors may alternatively be used. Further, the specific circuitry within the various circuit sections can be modified, and it would be possible to omit some sections or add new sections, without departing from the present invention. It should also be recognized that direct connections disclosed herein could be altered, such that two disclosed components or elements would be coupled to one another through an intermediate device or devices without being directly connected, while still realizing the present invention. Other changes, substitutions and alterations are also possible without departing from the spirit and scope of the present invention, as defined by the following claims.

What is claimed is:

1. An apparatus comprising:
   an input circuit having a first terminal and a second terminal, an input voltage being applied to said first terminal and a further voltage being generated at said second terminal, said further voltage being a function of said input voltage;
   an amplifier coupled to said second terminal of said input circuit and operable to output an amplified voltage, said amplified voltage being a function of said further voltage, said amplifier having a first current flowing therein which is proportional to said amplified voltage;
   a matcher coupled to said amplified voltage from said amplifier, said matcher being operable to generate a second current distinct from and proportional to said first current; and
   a compensator coupled to said matcher and responsive to said second current for generating a third current which is supplied to said second terminal of said input circuit and which has a magnitude such that a current flow out of said input circuit through said second terminal is substantially zero and said input voltage is substantially equal to said further voltage.

2. An apparatus according to claim 1, wherein said amplifier includes a first transistor having said first current flowing therethrough, and wherein said matcher includes a second transistor which is substantially identical to said first transistor and which has said second current flowing therethrough.

3. An apparatus according to claim 1,
   wherein said amplifier includes a first transistor having said first current flowing therethrough;
   wherein said matcher includes a second transistor which is substantially identical to said first transistor and which has said second current flowing therethrough; and
   wherein said compensator includes a third transistor which is substantially identical to said first and second transistors, and which has said third current flowing therethrough, said second and third transistors being coupled in series.

4. An apparatus according to claim 1,
   wherein said amplifier includes a first transistor having said first current flowing therethrough;
   wherein said matcher includes a second transistor which is substantially identical to said first transistor and which has said second current flowing therethrough;
   wherein said compensator includes a third transistor which is substantially identical to said first and second transistors, and which has said third current flowing therethrough, said second and third transistors being coupled in series; and
   including a level adjuster responsive to said amplified voltage from said amplifier for adjusting a voltage level of said amplified voltage so as to generate an adjusted voltage which is supplied to said matcher, said matcher generating said second current in response to said adjusted voltage.

5. An apparatus comprising:
   an input circuit which includes first, second, third and fourth terminals, said first and second terminals respectively having first and second voltages applied thereto, a third voltage which is a function of said first voltage being generated at said third terminal, and a fourth voltage which is a function of said second voltage being generated at said fourth terminal;
   a differential amplifier coupled to said third and fourth terminals of said input circuit and operable to output first and second amplified voltages which are respectively a function of said third voltage and a function of said fourth voltage, said amplifier having first and second currents flowing therein which are respectively proportional to said first and second amplified voltages;
   a differential matcher coupled to said first and second amplified voltages of said differential amplifier, said differential matcher being operable to generate a third and fourth currents which are distinct from each other and from said first and second currents, said third and fourth currents respectively being proportional to said first current and said second current;
   a differential compensator coupled to said differential matcher, said differential compensator being responsive to said third and fourth currents for respectively generating fifth and sixth currents, said fifth current being supplied to said third terminal of said differential input circuit and having a magnitude such that a current flow out of said differential input circuit through said third terminal is substantially zero and said first and third voltages are substantially equal, and said sixth current being supplied to said fourth terminal of said differential input circuit and having a magnitude such that a current flow out of said differential input circuit through said fourth terminal is substantially zero and said second and fourth voltages are substantially equal.

6. An apparatus according to claim 5, wherein said differential amplifier includes first and second transistors which respectively have said first and second currents flowing therethrough; and wherein said matcher includes third and fourth transistors which are respectively identical to said first and second transistors and which respectively have said third and fourth currents flowing therethrough.

7. An apparatus according to claim 5, wherein said differential amplifier includes first and second transistors which respectively have said first and second currents flowing therethrough;

wherein said matcher includes third and fourth transistors which are respectively identical to said first and second transistors and which respectively have said third and fourth currents flowing therethrough; and wherein said compensator includes fifth and sixth transistors which are respectively coupled in series with said third and fourth transistors, which are substantially identical to said first and second transistors, respectively, and which have said fifth and sixth currents respectively flowing therethrough, said third and fifth currents being the same current, and said fourth and sixth currents being the same current.

8. An apparatus according to claim 5, wherein said differential amplifier includes first and second transistors which respectively have said first and second currents flowing therethrough;

wherein said matcher includes third and fourth transistors which are respectively identical to said first and second transistors and which respectively have said third and fourth currents flowing therethrough;

wherein said compensator includes fifth and sixth transistors which are respectively coupled in series with said third and fourth transistors, which are substantially identical to said first and second transistors, respectively, and which have said fifth and sixth currents respectively flowing therethrough, said third and fifth currents being the same current, and said fourth and sixth currents being the same current;

wherein said amplifier includes first and second resistances which are each coupled between a source of power and a respective one of said first and second transistors, and which each have a respective one said first and second currents flowing therethrough; and wherein said matcher includes third and fourth resistances which are each coupled in series with a respective one of said third and fourth transistors, said third current flowing in sequence through said fifth transistor, said third transistor and said third resistance, and said fourth current flowing in sequence through said sixth transistor, said fourth transistor and said fourth resistance.

9. An apparatus according to claim 5, wherein said differential amplifier includes first and second transistors which respectively have said first and second currents flowing therethrough;

wherein said matcher includes third and fourth transistors which are respectively identical to said first and second transistors and which respectively have said third and fourth currents flowing therethrough;

wherein said compensator includes fifth and sixth transistors which are respectively coupled in series with said third and fourth transistors, which are substantially identical to said first and second transistors, respectively, and which have said fifth and sixth currents respectively flowing therethrough, said third and fifth currents being the same current, and said fourth and sixth currents being the same current;

wherein said amplifier includes first and second resistances which are each coupled between a source of power and a respective one of said first and second transistors, and which each have a respective one said first and second currents flowing therethrough;

wherein said matcher includes third and fourth resistances which are each coupled in series with a respective one of said third and fourth transistors, said third current flowing in sequence through said fifth transistor, said third transistor and said third resistance, and said fourth current flowing in sequence through said sixth transistor, said fourth transistor and said fourth resistance; and including a level adjuster which includes seventh and eighth transistors, which includes fifth and sixth resistances respectively coupled in series with said seventh and eighth transistors, and which includes a circuit operable to cause a seventh current of constant magnitude to flow through said seventh transistor and said fifth resistance, and an eighth current of constant magnitude to flow through said eighth transistor and said sixth resistance, said seventh and eighth transistors each having a control terminal coupled to a respective one of said first and second amplified voltages, said third transistor having a control terminal coupled to an end of said fifth resistance remote from said seventh transistor, and said fourth transistor having a control terminal coupled to an end of said sixth resistance remote from said eighth transistor.

10. An apparatus according to claim 9, wherein said fifth and sixth resistances are each self compensating for temperature variations so as to exhibit a substantially uniform resistance independent of temperature variations, said fifth and sixth resistances each including a first type of resistor and a second type of resistor which are coupled in series, said first type of resistor having a resistance which varies in proportion to temperature changes, and said second type of resistor having a resistance which varies in inverse proportion to temperature changes.

11. An apparatus according to claim 9, including a temperature compensation circuit coupled in series with said differential amplifier for effecting adjustments of said first and second currents as a function of temperature variations in order to compensate for variations of said first and second resistances as a function of temperature variations; and including a second temperature compensating circuit coupled in series with said matching circuit, said second temperature compensating circuit effecting adjustments of said third and fourth currents as a function of temperature changes in order to compensate for variations of said third and fourth resistances as a function of temperature variations.

12. An apparatus according to claim 5, wherein said differential amplifier includes first and second transistors which respectively have said first and second currents flowing therethrough;

wherein said matcher includes third and fourth transistors which are respectively identical to said first and second transistors and which respectively have said third and fourth currents flowing therethrough;

wherein said compensator includes fifth and sixth transistors which are respectively coupled in series with said third and fourth transistors, which are substantially identical to said first and second transistors, respectively, and which have said fifth and sixth currents respectively flowing therethrough, said third and fifth currents being the same current, and said fourth and sixth currents being the same current;

wherein said amplifier includes first and second resistances which are each coupled between a source of power and a respective one of said first and second transistors, and which each have a respective one said first and second currents flowing therethrough;

wherein said matcher includes third and fourth resistances which are each coupled in series with a respective one of said third and fourth transistors, said third current flowing in sequence through said fifth transistor, said third transistor and said third resistance, and said fourth current flowing in sequence through said sixth transistor, said fourth transistor and said fourth resistance; and wherein said compensator includes a seventh transistor which is coupled between a supply voltage and a control terminal of said fifth transistor, an eighth transistor which is substantially identical to said seventh transistor and which is coupled between said supply voltage and said second terminal, said seventh and eighth transistors each having a control terminal which is coupled to said control terminal of said fifth transistor; a ninth transistor which is coupled between said supply voltage and a control terminal of said sixth transistor, and a tenth transistor which is coupled between said supply voltage and said fourth terminal, said ninth and tenth transistors each having a control terminal which is coupled to said control terminal of said eighth transistor.

13. An apparatus according to claim 5, wherein said input circuit includes a first resistance coupled between said first and third terminals, and includes a second resistance coupled between said second and fourth terminals.

14. An apparatus according to claim 13, wherein said input circuit includes third and fourth resistances which are coupled in series with each other between a supply voltage and ground, a node between said third and fourth resistances being coupled to said third terminal; and wherein said input circuit includes fifth and sixth resistances which are coupled in series with each other between said supply voltage and ground, a node between said fifth and sixth resistances being coupled to said fourth terminal.

15. A method of effecting compensation in a circuit that includes an input portion responsive to an input voltage applied to a first terminal for generating at a second terminal a further voltage which is a function of said input voltage, and that includes an amplifier coupled to said second terminal and operable to output an amplified voltage that is a function of said further voltage, said method including:

causing a first current to flow in said amplifier, said first current being proportional to said amplified voltage;

generating in a matcher circuit coupled to said amplifier a second current which is distinct from and proportional to said first current;

generating in a compensator coupled to said matcher a third current which is a function of said second current; and supplying said third current to said second terminal of said input circuit, the magnitude of said third current being such that a current flow out of said input circuit through said second terminal is substantially zero, so that said input voltage is substantially equal to said further voltage.

* * * * *